United States Patent
Fujiwara

(10) Patent No.: US 7,459,766 B2
(45) Date of Patent: Dec. 2, 2008

(54) SEMICONDUCTOR BIPOLAR TRANSISTOR

(75) Inventor: Shuji Fujiwara, Hashima (JP)

(73) Assignee: Sanyo Electric Co., Ltd., Osaka (JP)

( * ) Notice: Subject to any disclaimer, the term of this patent is extended or adjusted under 35 U.S.C. 154(b) by 10 days.

(21) Appl. No.: 11/392,613

(22) Filed: Mar. 30, 2006

(65) Prior Publication Data

US 2006/0220104 A1    Oct. 5, 2006

(30) Foreign Application Priority Data

Mar. 31, 2005    (JP)    ............. 2005-100949

(51) Int. Cl.
*H01L 27/082* (2006.01)
(52) U.S. Cl. .............. 257/586; 257/557; 257/565; 257/517
(58) Field of Classification Search ........ 257/565, 257/571, 586, 592, E29.114, 517, 557
See application file for complete search history.

(56) References Cited

U.S. PATENT DOCUMENTS

| | | | | |
|---|---|---|---|---|
| 4,047,975 | A * | 9/1977 | Widmann | ........... 438/348 |
| 6,476,451 | B2 * | 11/2002 | Wong | ........... 257/374 |
| 6,570,242 | B1 * | 5/2003 | Johnson | ........... 257/593 |
| 6,828,635 | B2 * | 12/2004 | Panday et al. | ........... 257/370 |
| 6,869,840 | B2 * | 3/2005 | Chatterjee et al. | ........... 438/238 |
| 2004/0000694 | A1 * | 1/2004 | Johnson | ........... 257/378 |
| 2004/0253834 | A1 * | 12/2004 | Mothes et al. | ........... 438/778 |

FOREIGN PATENT DOCUMENTS

| | | |
|---|---|---|
| JP | 2004-079719 | 3/2004 |
| JP | 2004-087599 | 3/2004 |

OTHER PUBLICATIONS

Kittel, Charles (2005). Introduction to Solid State Physics. (Eighth Edition) New Jersey: John Wiley & Sons, Inc.*
Streetman, Ben and Banerjee, Sanjay (2006). Solid State Electronic Devices (sixth ed.). New Jersey: Pearson Prentice Hall. pp. 10-11.*

* cited by examiner

*Primary Examiner*—Allan R. Wilson
(74) *Attorney, Agent, or Firm*—McDermott Will & Emery LLP

(57) ABSTRACT

A semiconductor device including a bipolar transistor in which the collector resistance. The bipolar transistor includes a first conduction type semiconductor substrate having a main surface. A second conduction type collector region is formed in the semiconductor substrate. A shallow trench isolation structure isolates the main surface of the semiconductor substrate into two insulated active regions. A collector leading portion is formed in one of the active regions. A first conduction type base region and a second conduction type emitter region are formed on the other one of the active regions. The collector region has a first depth from the main surface immediately below the shallow trench isolation structure, and the collector region has a second depth from the main surface immediately below the two active regions. The first depth is less than the second depth.

12 Claims, 4 Drawing Sheets

SEMICONDUCTOR BIPOLAR TRANSISTOR

CROSS-REFERENCE TO RELATED APPLICATIONS

This application is based upon and claims the benefit of priority from prior Japanese Patent Application No. 2005-100949, filed on Mar. 31, 2005, the entire contents of which are incorporated herein by reference.

BACKGROUND OF THE INVENTION

The present invention relates to a semiconductor device including a bipolar transistor and a method for manufacturing the same.

FIG. 8 is a cross-sectional view showing the structure of a typical bipolar transistor described in, for example, Japanese Laid-Open Patent Publication No. 2004-87599. As shown in FIG. 8, the bipolar transistor 50 includes an N-type conductive layer collector region 52, which is formed in a P-type silicon substrate 51 through ion implantation, and a P-type conductive layer base region 53 and an N-type conductive layer emitter region 54, which are formed on a main surface S of the P-type silicon substrate 51.

A shallow trench isolation (STI) structure 55 is formed on the main surface S of the P-type silicon substrate 51. The STI structure 55 is formed by embedding an oxide film in a trench formed through anisotropic etching. The STI structure 55 isolates two insulated active regions 56 and 57 of the main surface S. A collector leading portion 58 made of an N-type high concentration layer is formed in the active region 56. The base region 53 and the emitter region 54 are formed on the active region 57.

The collector region 52 includes a high concentration layer 52a, which is formed at a location deeper than the lower end of the STI structure 55 and has a particularly high concentration of the N-type impurity. The high concentration layer 52a functions as a main conductive path in the collector region 52 during conduction between the collector and emitter. The concentration of the N-type impurity in the vicinity of the main surface S is low in the collector region 52. The curve L1 in FIG. 9 shows an example of the N-type impurity concentration distribution in the collector region 52.

The reduction of collector resistance is effective for improving the transistor properties of the bipolar transistor 50. The reduction of collector resistance is easily accomplished by increasing the implantation amount of the N-type impurity when forming the collector region 52. The N-type impurity concentration distribution of the collector region 52 in such a case is shown by curve L2 in FIG. 9. The concentration of the N-type impurity in the vicinity of the collector leading portion 58 is increased to reduce the collector resistance. However, the concentration of the N-type impurity near the interface of the collector region 52 and the base region 53 also increases when simply increasing the impurity implantation amount. This lowers the breakdown voltage BVceo between the emitter and collector.

The collector resistance can also be reduced by forming the collector leading portion 58 at a deep location. However, when forming the collector leading portion 58 at a deep location, the collector leading portion 58 becomes enlarged in the lateral direction. This may cause short-circuiting between the emitter and collector.

A semiconductor device that reduces collector resistance while avoiding reduction of the breakdown voltage BVceo between the emitter and collector is described in Japanese Laid-Open Patent Publication No. 2004-79719. As shown in FIG. 10, Japanese Laid-Open Patent Publication No. 2004-79719 describes a bipolar transistor 50a with a high concentration implantation layer 59 having an N-type impurity concentration that is higher than that of collector region 52. The high concentration implantation layer 59 is formed in parts of the collector region 52 excluding the region immediately below base region 53. In the bipolar transistor 50a with the high concentration implantation layer 59, the concentration of the N-type impurity in the vicinity of collector leading portion 58 is locally increased without increasing the concentration of the N-type impurity near the base region 53. Thus, the collector resistance is reduced while preventing the breakdown voltage BVceo between the emitter and collector from being lowered.

However, the N-type impurity concentration distribution in both of the collector region 52 and the high concentration implantation layer 59 must be controlled with high accuracy to obtain the desired property. This is difficult to accomplish during manufacturing processes. If the high concentration implantation layer 59, which has a high impurity concentration, is formed in a wide range at a deep location, this may hinder the insulation isolation with the STI structure 55 and cause short-circuiting between the emitter and collector.

SUMMARY OF THE INVENTION

The present invention provides a semiconductor device including a bipolar transistor in which the collector resistance is reduced and a method for manufacturing the same.

One aspect of the present invention is a semiconductor device provided with a bipolar transistor including a first conduction type semiconductor substrate having a main surface. A second conduction type collector region is formed in the semiconductor substrate. A shallow trench isolation structure isolates the main surface of the semiconductor substrate into two insulated active regions. A collector leading portion is formed in one of the active regions. A first conduction type base region and a second conduction type emitter region are formed on the other one of the active regions. The collector region has a first depth from the main surface immediately below the shallow trench isolation structure, and the collector region has a second depth from the main surface immediately below the two active regions. The first depth is less than the second depth.

A further aspect of the present invention is a method for manufacturing a semiconductor device including a bipolar transistor. The bipolar transistor includes a first conduction type semiconductor substrate having a main surface. A second conduction type collector region is formed in the semiconductor substrate. A shallow trench isolation structure isolates the main surface of the semiconductor substrate into two insulated active regions. A collector leading portion is formed in one of the active regions. A first conduction type base region and a second conduction type emitter region are formed on the other one of the active regions. The method includes forming the shallow trench isolation structure in the main surface of the semiconductor substrate, forming the collector region by performing ion implantation on the semiconductor including the shallow trench isolation structure at an angle orthogonal to the main surface, and forming the base region and the emitter region on the semiconductor including the collector region.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE PREFERRED EMBODIMENTS

The structure of a bipolar transistor 10 included in a semiconductor device according to a preferred embodiment of the present invention will now be described.

Figure 1:
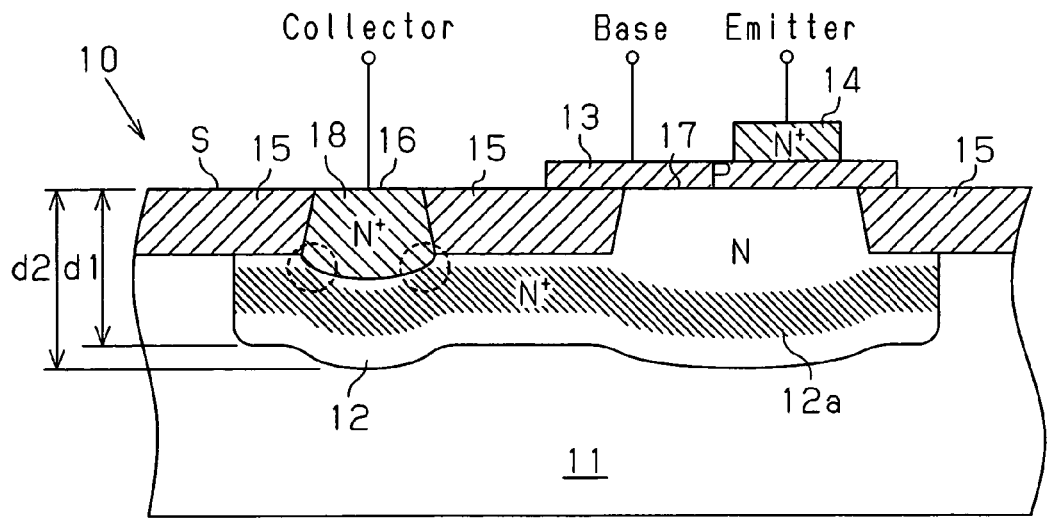
FIG. 1 is a cross-sectional view showing the structure of a bipolar transistor in a semiconductor device according to a preferred embodiment of the present invention.

Referring to FIG. 1, the bipolar transistor 10 is an NPN junction transistor. The bipolar transistor 10 includes an N-type conductive layer collector region 12, which is formed in the P-type silicon substrate 11 through ion implantation, and a P-type conductive layer base region 13 and an N-type conductive layer emitter region 14, which are formed on the collector region 12. The bipolar transistor 10 of the preferred embodiment is a vertical bipolar transistor in which the emitter region 14 is superimposed on the base region 13.

The collector region 12 includes a high concentration layer 12a, which is formed at a location spaced from a main surface S and has an especially high N-type impurity concentration. The high concentration layer 12a functions as a main conductive path in the collector region 12 during conduction between the emitter and collector.

An STI structure 15 is formed in the main surface S of the P-type silicon substrate 11. A trench embedded with an oxide film is formed in the STI structure 15 with a certain depth (e.g., 0.35 micrometer) from the main surface S of the P-type silicon substrate 11. The STI structure 15 isolates the main surface S of the P-type silicon substrate 11 formed on the collector region 12 into two insulated active regions 16 and 17 where silicon is exposed. The STI structure 15 is also arranged around the collector region 12 to isolate the bipolar transistor 10 in a manner insulated from other elements.

The base region 13 and the emitter region 14 are formed on one of the active regions (e.g., the active region 17) isolated by the STI structure 15. A collector leading portion 18 implanted with high concentration N-type impurities is formed in the other active region (e.g., the active region 16). The collector leading portion 18 includes a lower surface entirely protruding further downward from a lower surface of the STI structure 15. The bipolar transistor 10 is formed by electrically connecting a collector electrode to the collector leading portion 18, a base electrode to the base region 13, and an emitter electrode to the emitter region 14.

In a semiconductor device of the preferred embodiment, the depth from the main surface S at which the collector region 12 is formed differs between a location immediately below the STI structure 15 and a location immediately below the active regions 16 and 17. More specifically, the formation depth d1 of the collector region 12 immediately below the STI structure 15 is less than the formation depth d2 of the collector region 12 immediately below the active regions 16 and 17 (d1<d2). The formation depth of the high concentration layer 12a from the main surface S in the collector region 12 is also less than the active regions 16 and 17 immediately below the STI structure 15. In the example of FIG. 1, the lower surface of the collector region 12 includes first portions, which correspond to the active regions 16 and 17, and second portions, which are defined by regions excluding the second portions. The first portions extend downward from the second portions such that the lower surface of the collector region 12 is undulated.

Figure 8:
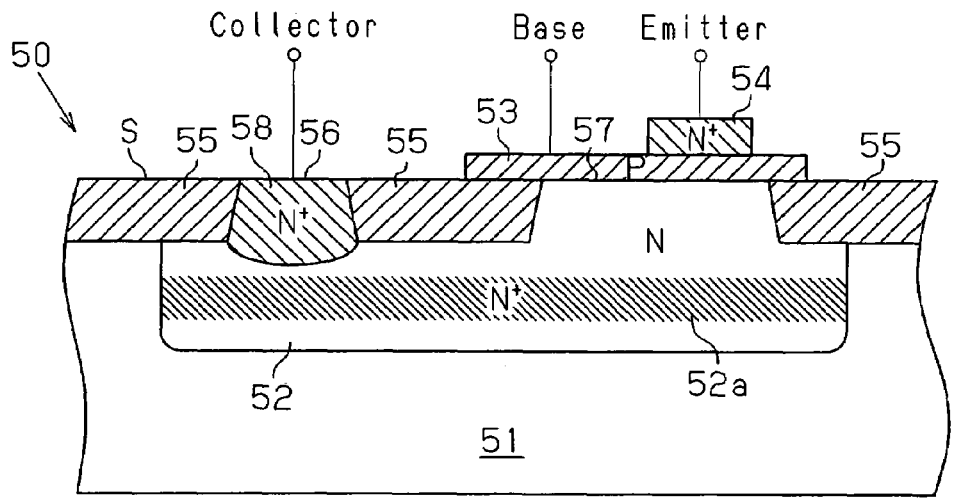
FIG. 8 is a cross-sectional view of a bipolar transistor included in a semiconductor device of a first prior art example.
Figure 9:
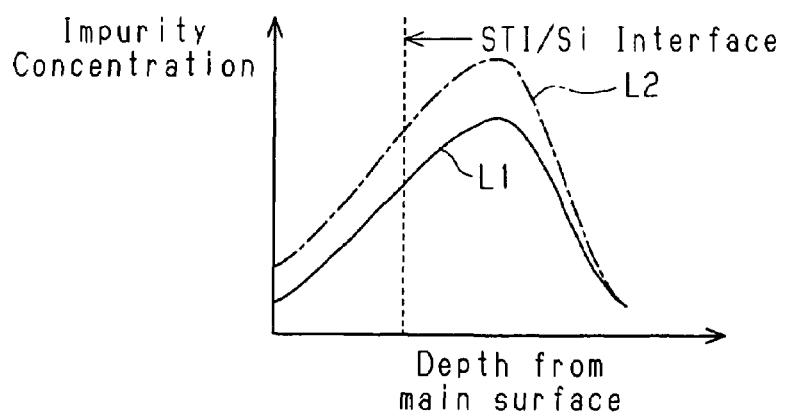
FIG. 9 is a graph showing the impurity concentration distribution of the collector region in the bipolar region of FIG. 8.
Figure 10:
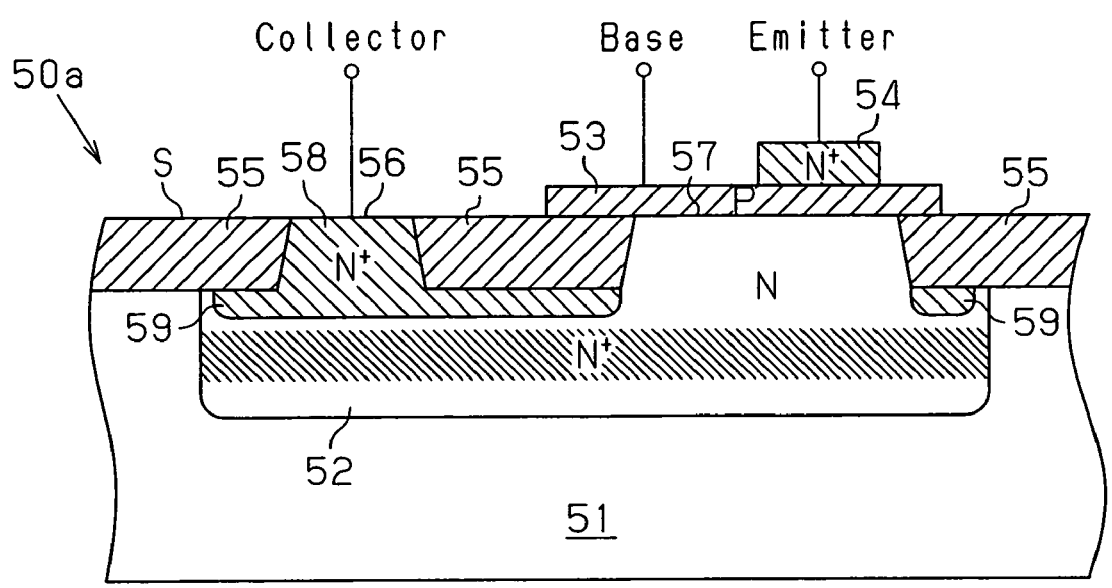
FIG. 10 is a cross-sectional view of a bipolar transistor included in a semiconductor device of a second prior art example.

In the bipolar transistor 10, the formation depth d1 of the collector region 12 immediately below the STI structure 15 may be decreased while keeping the formation depth d2 of the collector region 12 immediately below the active region 17, which includes the base region 13 and the emitter region 14, at a level that ensures sufficient breakdown voltage BVceo. Thus, the vicinity of the edges of the collector leading portion 18 encircled by broken lines in FIG. 1 is locally located near the high concentration layer 12a, which is formed at a shallow position immediately below the STI structure 15. Thus, the conductive resistance between the collector leading portion 18 and the high concentration layer 12a of the collector region 12 remains low. This reduces the collector resistance. At portions excluding the vicinity of the edges collector leading portion 18 encircled by the broken lines in FIG. 1, the lower surface of the collector leading portion 18 is relatively spaced from the high concentration layer 12a. In the typical structure of FIG. 8, the vicinity of the edges of the lower surface of the collector leading portion 58 is relatively spaced from the high concentration layer 52a.

The procedures for manufacturing the semiconductor device of the preferred embodiment will now be described with reference to FIGS. 2 to 6. The manufacturing of the bipolar transistor 10 in the semiconductor device is performed in the following manner.

Figure 2:
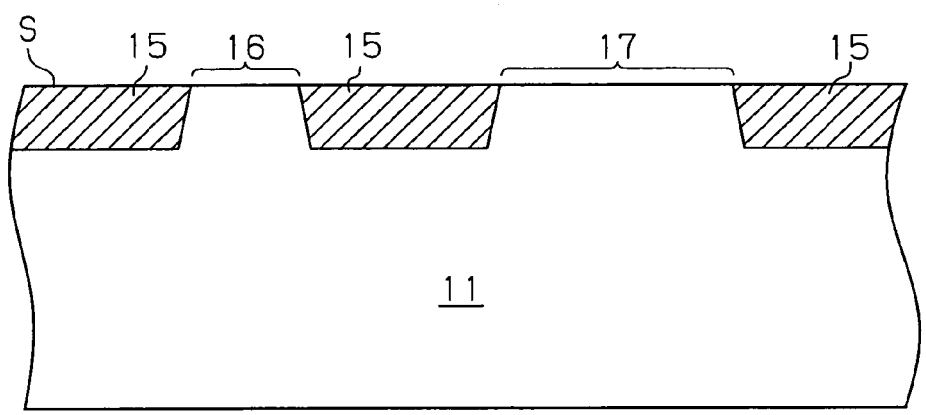
FIGS. 2 to 4 are cross-sectional views showing procedures for manufacturing the bipolar transistor of FIG. 1.
Figure 3:
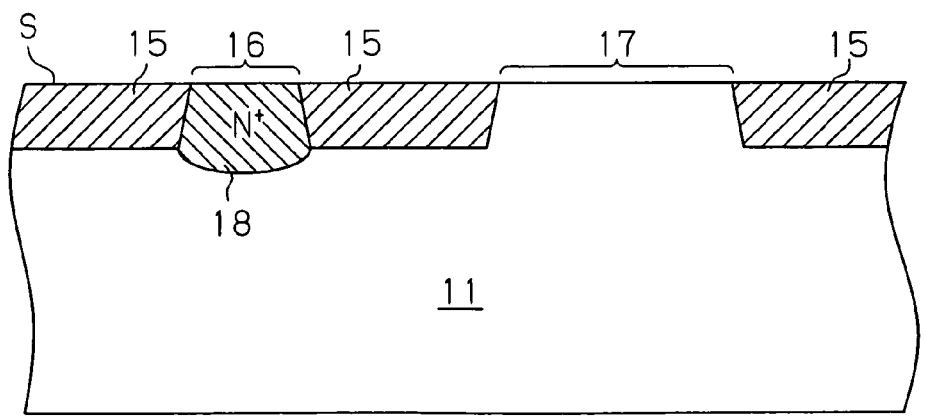

Referring to FIG. 2, the STI structure 15 is first formed in the main surface S of the P-type silicon substrate 11. The STI structure 15 is formed by forming a trench having a certain depth in the main surface S of the P-type silicon substrate 11 by performing, for example, anisotropic etching so as to surround the active regions 16 and 17. Then, the trench is embedded with an oxide film, and the main surface S is flattened.

Next, a mask is applied to portions of the P-type silicon substrate 11 excluding the active region 16, and N-type impurities are ion-implanted to form a high concentration N-type conductive layer in the active region 16. This forms the collector leading portion 18 shown in FIG. 3. The ion implantation is performed by implanting phosphorous (P) ions, for example, with an acceleration energy of approximately 50 to 1000 keV and a density of $1\times10^{14}$ to $1\times10^{16}$ per square centimeter.

Subsequently, ion implantation is performed to form the collector region 12. Generally, the implantation of ions in a silicon substrate is performed at an angle (e.g. 7 degrees) slightly inclined with respect to a direction orthogonal to the main surface S. This is because the silicon crystal of the silicon substrate has a diamond structure, and atoms are arrayed in the direction orthogonal to the main surface S. As a result, some of the ions permeate into a deep portion of the silicon substrate without colliding against any atoms. This phenomenon is referred to as a so-called channeling that occurs when ion implantation is performed in a direction orthogonal to the main surface S, which extends along the crystal axis. The ion implantation is normally performed at an angle slightly inclined relative to the crystal axis of silicon so that all of the implanted ions collide against the atoms of the silicon substrate. This prevents the channeling phenomenon from occurring.

Figure 4:
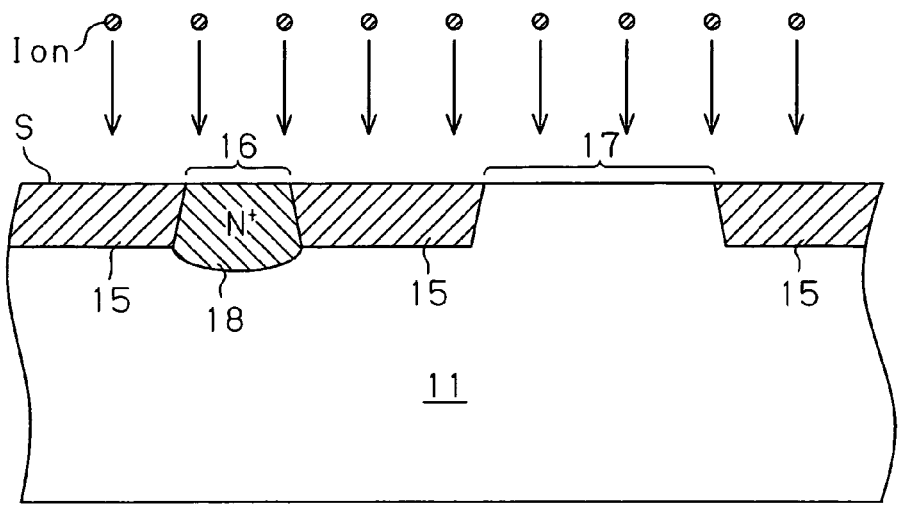

However, referring to FIG. 4, in the preferred embodiment, ion implantation for forming the collector region 12 is nevertheless performed at an angle orthogonal to the main surface S. The reason for this will now be discussed.

When ion implantation is performed at an angle orthogonal to the main surface S from above the active regions 16 and 17 at which silicon crystals are exposed from the main surface S, N-type impurities are added at deeper positions of the P-type silicon substrate 11 due to the channeling phenomenon. If ion implantation is performed at an angle orthogonal to the main surface S from above the regions where the STI structure 15 is formed in the main surface S, the implanted ions are scattered in the STI structure 15 since the silicon oxide film forming the STI structure 15 has an amorphous structure. Thus, the channeling phenomenon does not occur, and the depth of the regions to which the N-type impurity are added is shallow. After the formation of the STI structure 15, if ion implantation is performed at an angle orthogonal to the main surface S from above the silicon substrate 11, only the formation depth d2 of the collector region 12 immediately below the STI structure 15 may be locally decreased.

The formation of the collector region 12 through the orthogonal ion implantation may be performed by implanting ions, for example, with an acceleration energy of 200 to 2000 keV and a density of $1\times10^{13}$ to $1\times10^{15}$ per square centimeter using phosphorus (P) as the N-type impurities.

Figure 5A:
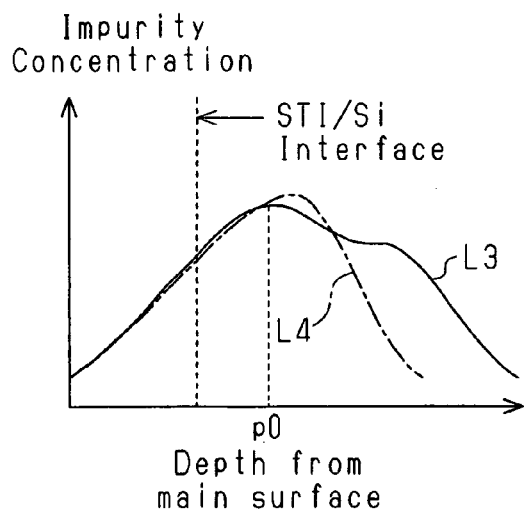
FIGS. 5A and 5B are graphs showing N-type impurity concentration distribution in the collector region immediately below the active region and immediately below the STI structure in the semiconductor device of FIG. 1.

Curve L3 in FIG. 5A shows the N-type impurity concentration distribution in the collector region 12 immediately below the active regions 16 and 17 when phosphorous is implanted with an acceleration energy of 700 keV at an angle orthogonal to the main surface S. Curve L4 shows the N-type impurity concentration distribution in the collector region 12 immediately below the active regions 16 and 17 when phosphorous is ion implanted with an acceleration energy of 900 keV at an angle inclined by 7 degrees with respect to a direction orthogonal to the main surface S. The STI/Si interface in FIGS. 5A and 5B indicates the depth of the interface between the lower surface of the STI structure 15 and the P-type silicon substrate 11.

Referring to FIG. 5A, the channeling phenomenon occurs when implanting ions at an orthogonal angle. Thus, at the peak position of the impurity concentration located at the vicinity of depth p0 (about 0.8 micrometers in the example of FIG. 5A) from the main surface S, the N-type impurity concentration distribution is substantially the same as when ions are implanted at an angle inclined by 7 degrees regardless of the lower acceleration energy. Therefore, in the range where the depth is equal to or less than p0, the breakdown voltage BVceo between the emitter and collector of the bipolar transistor having the collector region formed to have the concentration distribution of the curve L3 is substantially the same as that of the curve L4.

Figure 5B:
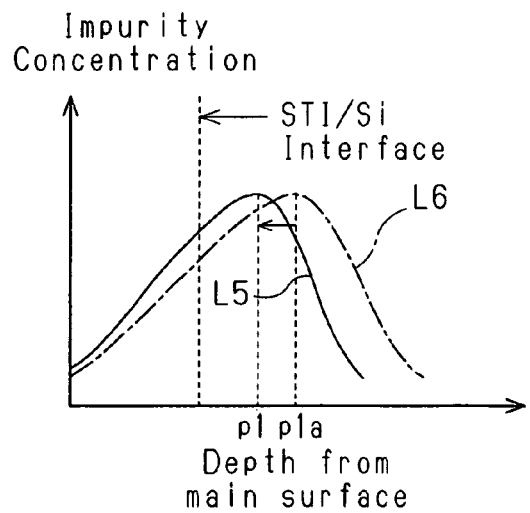

Curve L5 in FIG. 5B shows the N-type impurity concentration distribution in the collector region 12 immediately below the STI structure 15 when phosphorous is implanted with an acceleration energy of 700 keV at an angle orthogonal to the main surface S. Curve L6 shows the N-type impurity concentration distribution in the collector region 12 immediately below the STI structure 15 when phosphorous is ion implanted with an acceleration energy of 900 keV at an angle inclined by 7 degrees with respect to the direction orthogonal to the main surface S. As shown in FIG. 5B, since the channeling phenomenon does not occur immediately below the STI structure 15 in both of these cases, the formation depth of the collector region 12 is less in the orthogonal ion implantation since the acceleration energy is lower. In the example of FIG. 5B, the peak position of the impurity concentration located at depth p1 from the main surface S during orthogonal implantation is shallower by about 0.2 micrometers than the peak position located at depth p1a when ions are implanted at an angle of 7 degrees.

Due to the orthogonal ion implantation, the collector region 12 located immediately below the STI structure 15 has a shallower formation depth than the collector region 12 located immediately below the active regions 16 and 17 (refer to FIG. 6). In the bipolar transistor 10 including the collector region 12, the breakdown voltage BVceo is kept high while the collector resistance is reduced.

An example in which the relationship between the formation depth of the collector region and the reduction of the collector resistance was checked will now be described.

First, a plurality of bipolar transistors were prepared. The bipolar transistors had collector regions 12 that were formed at different depths immediately below the STI structure 15. The collector resistance of each bipolar transistor was measured. Each bipolar transistor was prepared by implanting phosphorous at an angle orthogonal to the main surface S. The formation depth of the collector region 12 was differed for every transistor by changing the acceleration energy during the phosphorous implantation. In one example, the acceleration energy for the phosphorous implantation was 700 keV at locations immediately below the active regions 16 and 17, and the acceleration energy for the phosphorous implantation was changed to a different value at locations immediately below the STI structure 15. In each bipolar transistor, the thickness (depth from the main surface S to the bottom surface of the STI structure 15) of the STI structure 15 was 0.35 micrometers, and the collector leading portion 18 was formed by ion implanting phosphorous with an acceleration energy of 100 keV.

Figure 6:
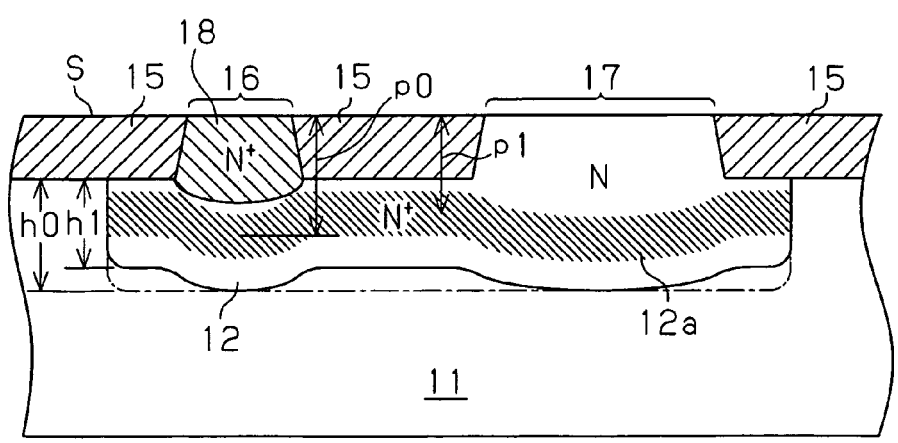
FIG. 6 is a cross-sectional view showing the bipolar transistor in a manufacturing step of the preferred embodiment.
Figure 7:
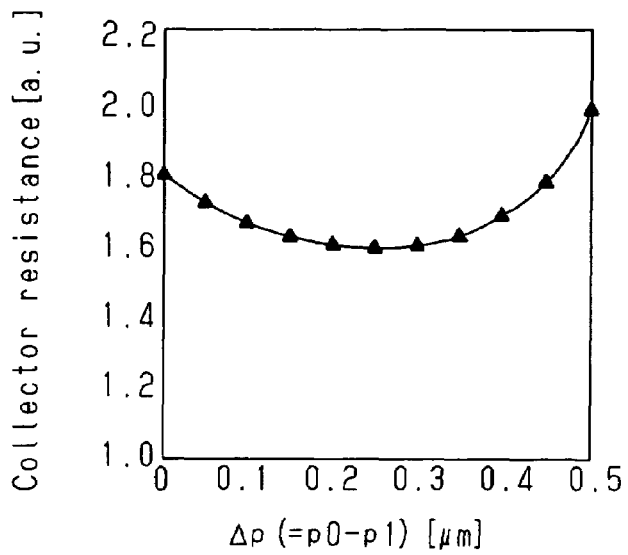
FIG. 7 is a graph showing the results of an example, in which the horizontal axis represents the difference between the depth (p0) at an impurity concentration peak position immediately below the active region and the depth (p1) at an impurity concentration peak position immediately below the STI structure in the bipolar transistor and the vertical axis represents the collector resistance.

The results of the example are shown in FIG. 7. The vertical axis of the graph in FIG. 7 represents the collector resistance of each bipolar transistor. The horizontal axis of the graph in FIG. 7 represents the difference $\Delta p$ between depth p0 and depth p1, or p0-p1, for each bipolar transistor. As shown in FIG. 6, the depth p0 represents the depth from the main surface at the peak position of the impurity concentration in the collector region 12 immediately below the active regions 16 and 17 of each bipolar transistor. The depth p1 represents the depth from the main surface S at the peak position of the impurity concentration in the collector region 12 immediately below the STI structure 15 of each bipolar transistor.

As shown in FIG. 7, when the depth difference $\Delta p$ is in the range of 0 to 0.25 micrometers, the collector resistance decreases as the depth difference Δp increases, that is, as the formation depth of the collector region 12 immediately below the STI structure 15 decreases. As described above, this is because the edge of the collector leading portion 18, which is encircled by a broken line in FIG. 1, becomes closer to the high concentration layer 12a below the STI structure 15 as the high concentration layer 12a of the collector 12 below the STI structure 15 becomes shallower. As the depth difference Δp exceeds approximately 0.25 micrometers and further increases, the collector resistance increases as the depth difference Δp increases. This is because part of the high concentration layer 12a enters the STI structure 15 and narrows the conductive layer below the STI structure 15 when the high concentration layer 12a is located near the main surface S.

In the example, the collector region 12 of the bipolar transistor is formed below the active regions 16 and 17 and below the STI structure 15 through separate implantations. However, the method of ion implantation subtly influences the above described tendency. It is believed that the same tendency would be obtained even when implantation at locations immediately below the active regions 16 and 17 and implantation at locations immediately below the STI structure 15 are simultaneously performed. In the preferred embodiment, the ion implantations related to the formation of the collector region 12 at locations immediately below the active regions 16 and 17 and locations immediately below the STI structure 15 are simultaneously performed in the bipolar transistor 10. The ion implantations are performed at an angle orthogonal to the main surface S, and the depth p1 at locations immediately below the STI structure 15 is less than the depth p0 at locations immediately below the active regions 16 and 17 by about 0.2 micrometers. The depth difference Δp substantially matches the value in which the collector resistance becomes minimum. It is thus apparent that the collector resistance is effectively reduced.

In each bipolar transistor used in the example, the acceleration energy of ion implantation for immediately below the active regions 16 and 17 is 700 keV. However, an increase in the acceleration energy would cause the depth difference Δp at which the collector resistance becomes minimum to become larger than the value (approximately, 0.25 micrometers) obtained in the result of the example. A decrease in the acceleration energy during ion implantation would cause the depth difference Δp at which the collector resistance becomes minimum to become less than the value obtained in the result of the example. Such a value also changes depending on the thickness of the STI structure 15, the formation depth of the collector leading portion 18, and the like. In any case, if orthogonal implantation of ions is performed by appropriately adjusting the acceleration energy so that the depth difference Δp becomes an appropriate value, reduction of the collector resistance is enabled, whereas this is not possible in the prior art in which the formation depth of the collector region 12 is uniform, that is, the depth difference Δp is zero. In a bipolar transistor, the reduction of collector resistance is effectively performed by setting the depth difference Δp in a range of 0.1 to 0.3 micrometers.

In FIG. 6, the broken lines show a state in which the formation range of the collector region when the breakdown voltage BVceo is about the same, that is, when the depth of the high concentration layer 12a at locations immediately below the active region 17 is about the same and the formation depth of the high concentration layer 12a is entirely uniform. In the bipolar transistor 10 of the preferred embodiment, even if the breakdown voltage BVceo is the same, the height h1 of a side surface component of the collector region 12 contacting the P-type silicon substrate 11 is less than the height h0 of that when the collector region 12 has a uniform depth, as shown in FIG. 6. Accordingly, in the bipolar transistor 10 of the preferred embodiment, the surface area of the peripheral side surface of the collector region 12 is reduced. This lowers the capacitance at the interface of the collector region 12 and the P-type silicon substrate 11, which are of different conduction types. That is, the collector-substrate capacitance is lowered. The collector-substrate capacitance of the entire transistor may be lowered by reducing the peripheral side surface component.

In the preferred embodiment, the P-type silicon substrate 11 corresponds to a first conduction type semiconductor substrate, the N-type conductive layer collector region 12 corresponds to a second conduction type collector region, the P-type conductive layer base region 13 corresponds to a first conduction type base region, and the N-type conductive layer emitter region 14 corresponds to the second conduction type emitter region.

The preferred embodiment has the advantages described below.

(1) The collector resistance is reduced in an optimal manner without lowering the emitter-collector breakdown voltage BVceo.

(2) The formation depth of the collector region 12 is changed just by changing the angle in ion implantation when forming the collector region 12 using the difference in the properties of the components of the main surface S. Thus, the bipolar transistor 10 having advantage (1) can be easily manufactured.

(3) The peripheral side surface component of the collector-substrate capacitance is reduced. This lowers the collector-substrate capacitance of the entire transistor.

(4) The collector region 12 immediately below the STI structure 15 is relatively shallow, the impurity concentration of the collector region 12 near the edge of the collector leading portion 18 contacting the STI structure 15 is high, and the collector resistance is lowered. The collector region 12 immediately below the active region 17, at which the base region 13 and the emitter region 14 are formed, is relatively deep. This prevents the emitter-collector breakdown voltage from being lowered.

It should be apparent to those skilled in the art that the present invention may be embodied in many other specific forms without departing from the spirit or scope of the invention. Particularly, it should be understood that the present invention may be embodied in the following forms.

As long as the formation depth of the collector region 12 can be differed between locations immediately below the STI structure 15 and locations immediately below the active regions 16 and 17 in the same manner as in the preferred embodiment, the method for fabricating the collector region 12 is not limited in any manner as described in the preferred embodiment and may be changed when necessary. In such a case, the advantages (1) and (3) are still obtained. For instance, the formation depth of the collector region 12 at locations immediately below the STI structure 15 may be shallower than locations immediately below the active regions 16 and 17 by performing separate ion implantations under different conditions for locations immediately below the STI structure 15 and locations immediately below the active regions 16 and 17, for example, in the same manner as in the above described example.

The present invention is not limited to the semiconductor device including an NPN junction bipolar transistor and is also applicable to a PNP junction bipolar transistor including a P-type conductive layer collector region, an N-type conductive layer base region, and a P-type conductive layer emitter region.

As long as the bipolar transistor is a bipolar transistor including the STI structure, the present invention is applicable to a bipolar transistor having, for example, an SiGe hetero junction.

The present examples and embodiments are to be considered as illustrative and not restrictive, and the invention is not to be limited to the details given herein, but may be modified within the scope and equivalence of the appended claims.

What is claimed is:

1. A semiconductor device comprising:
   a bipolar transistor including;
      a first conduction type semiconductor substrate having a main surface;
      a second conduction type collector region formed in the semiconductor substrate;
      a shallow trench isolation structure for isolating the main surface of the semiconductor substrate into two active regions;
      a collector leading portion formed in one of the active regions; and
      a first conduction type base region and a second conduction type emitter region formed on the other one of the active regions, wherein the collector region has a first portion formed immediately below the shallow trench isolation structure and aligned with the shallow trench isolation structure and two second portions formed immediately below the two active regions and respectively aligned with the two active regions, wherein the first portion is formed at a first depth from the main surface and the two second portions are formed at a second depth from the main surface, with the first depth being less than the second depth, and wherein the two second portions are formed at substantially the same depth.

2. The semiconductor device according to claim 1, wherein the shallow trench isolation structure is one of a plurality of shallow trench isolation structures and the first portion of the collector region is one of plurality of first portions formed immediately below the shallow trench isolation structure and respectively aligned with the plurality of shallow trench isolation structures and having the same depth.

3. The semiconductor device according to claim 1, wherein the main surface of the semiconductor substrate is flat, and the collector region has an undulated lower surface.

4. The semiconductor device according to claim 1, wherein the collector leading portion and the shallow trench isolation structure each have a lower surface, with the lower surface of the collector leading portion entirely protruding downward from the lower surface of the shallow trench isolation structure.

5. The semiconductor device according to claim 1, wherein the collector leading portion has a lower surface that is locally close to the high concentration layer at locations below the boundary of the collector leading portion and the shallow trench isolation structure.

6. The semiconductor device according to claim 1, wherein the semiconductor substrate includes silicon crystals having a diamond structure, and the shallow trench isolation structure includes a silicon oxide film having an amorphous structure.

7. A method for manufacturing a semiconductor device including a bipolar transistor, the bipolar transistor including a first conduction type semiconductor substrate having a main surface, a second conduction type collector region formed in the semiconductor substrate, a shallow trench isolation structure for isolating the main surface of the semiconductor substrate into two active regions, a collector leading portion formed in one of the active regions, and a first conduction type base region and a second conduction type emitter region formed on the other one of the active regions, wherein the collector region has a first portion formed immediately below the shallow trench isolation structure and aligned with the shallow trench isolation structure and two second portions formed immediately below the two active regions and respectively aligned with the two active regions, wherein the first portion is formed at a first depth from the main surface and the two second portions are formed at a second depth from the main surface, with the first depth being less than the second depth, and the two second portions are formed at substantially the same depth, the method comprising:
   forming the shallow trench isolation structure in the main surface of the semiconductor substrate;
   after forming the shallow trench isolation structure, forming the collector region by performing ion implantation on the semiconductor substrate including the shallow trench isolation structure at an angle orthogonal to the main surface; and
   forming the base region and the emitter region on the semiconductor substrate including the collector region.

8. The method according to claim 7, wherein the shallow trench isolation structure is one of a plurality of shallow trench isolation structures and the first portion of the collector region is one of a plurality of first portions formed immediately below the shallow trench isolation structure and respectively aligned with the plurality of shallow trench isolation structures and having the same depth.

9. The method according to claim 7, wherein said forming the collector region includes performing ion implantation so that the collector region has an undulated lower surface.

10. The method according to claim 7, further comprising:
    forming the collector leading portion on either one of the two active regions prior to said forming the collector region, wherein said forming the collector leading portion includes performing ion implantation so that a lower surface of the collector leading portion is entirely protruded downward from a lower surface of the shallow trench isolation structure.

11. The method according to claim 7, wherein said forming the collector region includes performing ion implantation so that the high concentration layer is locally close to the collector leading portion at locations below the boundary of the collector leading portion and the shallow trench isolation structure.

12. The method according to claim 7, wherein the semiconductor substrate includes silicon crystals having a diamond structure, and the shallow trench isolation structure includes a silicon oxide film having an amorphous structure.

* * * * *